(12) United States Patent
Tsuji et al.

(10) Patent No.: US 6,903,799 B2
(45) Date of Patent: Jun. 7, 2005

(54) EXPOSURE METHOD AND EXPOSURE APPARATUS

(75) Inventors: Toshihiko Tsuji, Saitama (JP); Takaaki Kimura, Konosu (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/603,807

(22) Filed: Jun. 26, 2003

(65) Prior Publication Data

US 2004/0141164 A1 Jul. 22, 2004

Related U.S. Application Data

(63) Continuation of application No. PCT/JP01/11635, filed on Dec. 28, 2001.

(30) Foreign Application Priority Data

Dec. 28, 2000 (JP) ........................................ 2000-402275

(51) Int. Cl.⁷ ........................... G03B 27/52; G03B 27/42
(52) U.S. Cl. ............................................ 355/30; 355/53
(58) Field of Search .......................... 355/30, 53, 67–71; 307/64

(56) References Cited

U.S. PATENT DOCUMENTS 4,786,947 A * 11/1988 Kosugi et al. ................. 355/30
5,828,572 A * 10/1998 Hasegawa et al. ........... 700/117
6,304,005 B1 * 10/2001 Aoki et al. ..................... 307/64

FOREIGN PATENT DOCUMENTS

| JP | A 2-148822 | 6/1990 |
| JP | 06-019520 | * 1/1994 |
| JP | A 11-204390 | 7/1999 |
| JP | A 2000-100717 | 4/2000 |
| JP | A 2000-252194 | 9/2000 |
| JP | A 2000-331921 | 11/2000 |
| JP | A 2001-218424 | 8/2001 |

* cited by examiner

Primary Examiner—Henry Hung Nguyen
(74) Attorney, Agent, or Firm—Oliff & Berridge PLC

(57) ABSTRACT

The present invention provides an exposure method and exposure apparatus that enable the effects on an apparatus main body of heat generated by a control system to be suppressed when an error occurs in an air-conditioning system or temperature control system. In the exposure apparatus of the present invention, if an error occurs in an air-conditioning system (50) that air-conditions an interior of a chamber (11 to 16) in which an exposure body section (STP) is housed or occurs in a temperature control system (52) that controls a temperature of the exposure body section (STP), a power supply of a control system (53 to 56) that controls the exposure body section (STP) is shut down.

30 Claims, 4 Drawing Sheets

EXPOSURE METHOD AND EXPOSURE APPARATUS

This application is a continuation of PCT/JP01/11635 filed Dec. 28, 2000.

BACKGROUND OF THE INVENTION

1. Field of the Invention

The present invention relates to an exposure method and exposure apparatus for transferring a mask pattern onto a photosensitive substrate in an exposure body section. In particular, the present invention relates to the control of an exposure method and exposure apparatus when an error occurs in an air-conditioning system or temperature control system.

2. Description of Related Art

Exposure apparatuses used in a photolithography step in the manufacture of electronic devices such as semiconductor devices (e.g., integrated circuits) and liquid crystal displays are installed inside a clean room. However, because a purified environment is necessary, the exposure body section (which includes the apparatus body and the like described below), in particular, is installed inside a chamber such as an environmental chamber. An air-conditioning system is provided in the chamber, so that temperature control is performed inside the chamber. In addition, the air-conditioning system enables the air in the chamber to be purified by the use of filters such as high efficiency particle air (HEPA) filters and chemical filters and the like.

In many cases, at least a portion of a control system (i.e., a control unit) that performs the control of each section of the exposure body section that carries out exposure processing (i.e., performs movement control of movable sections such as a stage, controls exposure conditions, controls transporting systems such as those for the mask and photosensitive substrate (i.e., substrates such as wafers and glass plates on whose surface photoresist has been coated—referred to below simply as "wafers"), and performs other control) and also supplies power and the like is mounted integrally inside a chamber that houses the apparatus main body, or is located close to the apparatus main body. In addition, a temperature control system that cools instruments that heat up comparatively easily such as motors for the optical system and transporting systems is provided in the apparatus main body.

If an error occurs in such air-conditioning systems and temperature control systems, the error is made known to an operator or the like, however, if there is a delay in the recovery operation by the operator, then the temperature of the apparatus main body and inside the chamber may increase considerably due to the heat generated by the aforementioned control system. In this case, there is a possibility that the recovery in the apparatus main body will be hindered by harmful effects caused by the heat generated by the control system, such as the placement condition of optical elements being changed, or the optical characteristics of the optical elements themselves being changed because of a difference between the coefficient of thermal expansion of the optical elements and the coefficient of thermal expansion of holding members that hold the optical elements. Moreover, even if no error occurs in the air-conditioning system or temperature control system, if the respective power supplies of the air-conditioning system, the temperature control system, and the control system are not shut down in the correct sequence, then there is the possibility that, in the same way as is described above, heat generated by the control system and the like will have a deleterious effect on the performance of the apparatus (i.e., on the characteristics of the optical system and the like). Exposure apparatuses that purge at least a portion of an optical path of exposure illumination light inside the chamber using an inert gas such as nitrogen or helium are currently in practical use, however, in these exposure apparatuses there is the possibility that, if the power supplies of gas supply apparatuses that supply inert gases and the like are shut down without consideration given to the timing of the shutting down of the control system and the like, the same problems as those in the above described air-conditioning systems and temperature control systems will be created.

SUMMARY OF THE INVENTION

The present invention was conceived in view of the above described circumstances and it is an object thereof to provide an exposure method and exposure apparatus that enable the effects on the apparatus main body of heat generated by a control system to be suppressed when an error occurs in an air-conditioning system or temperature control system. It is a further object of the present invention to provide an exposure method and exposure apparatus in which a plurality of power supplies are shut down in the correct sequence so as, for example, to suppress any deterioration in the performance (i.e., optical characteristics and the like) of the apparatus.

In order to solve the above described problems, the present invention is an exposure method in which a mask pattern is exposed onto a photosensitive substrate by an exposure body section (STP), wherein if an error occurs in an air-conditioning system (50) that air-conditions an interior of a chamber (11 to 16) in which the exposure body section (STP) is housed or occurs in a temperature control system (52) that controls a temperature of the exposure body section (STP), a power supply of a control system (53 to 56) that controls the exposure body section (STP) is shut down.

In this exposure method, by shutting down the power supply of a control system (53 to 56) when an error (for example, an unrecoverable error) occurs in an air-conditioning system (50) or a temperature control system (52), heat generated by the control system (53 to 56) is reduced, and any increase in temperature in the chamber (11 to 16) or exposure body section (STP) is suppressed. Accordingly, it is possible to suppress any effects caused by heat generated by the control system (53 to 56) on the exposure body section (STP).

In this case, the power supply may be shut down after a predetermined length of time has passed since the error occurred in the air-conditioning system (50) or the temperature control system (52).

In this case, the predetermined length of time may include a length of time (Ta) to allow an operation of the exposure body section (STP) to be stopped. By employing this method, it is possible to restrict the occurrence of a malfunction of the exposure body section (STP) that may be caused by the shutting down of the power supply.

Moreover, when an error has occurred in the air-conditioning system (50) or the temperature control system (52), the predetermined length of time may include a waiting time (Tb) in which a command regarding the error is awaited after the error has been announced. In this case, by canceling the error during this waiting time, is possible to avoid any unnecessary shut down of the power supply.

In this case, it is possible to reliably shut down the power supply by forcibly shutting down the power supply after the waiting time has passed.

Moreover, before the power supply is shut down, it is possible to store an operating state of the exposure body section (STP) at the time the error occurred in the air-conditioning system (50) or the temperature control system (52). In this case, by using the stored operating state, is possible to rapidly restore the exposure body section (STP) to the stage it was at before the error occurred.

In addition, by shutting down the power supply of the air-conditioning system (50) or the temperature control system (52) after the power supply of the control system (54 to 56) has been shut down, it is possible to reliably suppress any increase in temperature of the exposure body section (STP) that is due to heat from the control system (54 to 56).

The present invention is also an exposure method in which a substrate is exposed using illumination light irradiated via a mask by an exposure body section (STP) of which at least a portion is housed within a chamber (11 to 16), wherein a power supply of a second control system (54 to 56) that controls operations of the exposure body section (STP) is shut down prior to a power supply of a first control system (51, 53) that controls an environment within the chamber (11 to 16) being shut down.

In this exposure method, because the environment inside the chamber (11 to 16) is controlled by a first control system (51, 53) until the power supply of a second control system (54 to 56) is shut down, any increase in the temperature of the exposure body section (STP) caused by heat from the second control system (54 to 56) is suppressed, and it is possible to reliably prevent any deterioration in the apparatus performance of the exposure apparatus (i.e., optical characteristics and the like). Note that the term "environment control" includes, in addition to air-conditioning and temperature control, purge control to purge a predetermined space and the like. Furthermore, it includes not only temperature control of a purging gas such as air or an inert gas that is supplied to the chamber (11 to 16), but also control of the pressure and humidity thereof.

Furthermore, the above described exposure method may be implemented using an exposure apparatus comprising: an exposure body section (STP) that exposes a mask pattern onto a photosensitive substrate; and a control system (53 to 56) that controls operations of the exposure body section (STP), wherein there is provided at least one of an air-conditioning system (50) that conditions air in a chamber (11 to 16) in which the exposure body section (STP) is housed, and a temperature control system (52) that controls a temperature of the exposure body section (STP), and there is provided a power supply shutdown system that shuts down a power supply of exposure body section (STP) and the control system (53 to 56) when an error (for example, an unrecoverable error) occurs in the air-conditioning system (50) or temperature control system (52).

A device manufacturing method that includes a step in which, using the above described exposure apparatus, a device pattern is transferred onto a photosensitive layer formed on an object is included in the present invention.

Moreover, in the above described exposure method, it is also possible for a power supply of the air-conditioning system or temperature control system to be shut down after a predetermined time has passed since the error occurred, and for a power supply of the control system to be shut down at a timing that allows effects of the shutting down of the air-conditioning system and temperature control system on the exposure main body to be kept within a permissible range.

In this case, for example, a power supply of the control system is stut down after a deferment period has passed since the error occurred in order to allow an operation of the exposure body section to be stopped, and a power supply of the air-conditioning system or temperature control system is shut down substantially simultaneously with a shutting down of a power supply of the control system or after the power supply of the control system has been shut down. Furthermore, measurement of the deferment period may commence after a first waiting time since the error occurred has passed.

Moreover, when the power supply of the control system is shut down as a result of the main power supply of the exposure body section being shut down, the power supply of the air-conditioning system or temperature control system is shut down at the same time as the power supply of the control system is shut down. In this case, if the main power supply is not shut down even when the deferment period has passed, the power supply of the control system is shut down at the same time as the power supply of the air-conditioning system or temperature control system is shut down by shutting down the main power supply after the predetermined time has passed.

The predetermined time includes a second waiting time that may be set, for example, after the error occurs. The second waiting time may also be set longer than the first waiting time.

The above described shutting down of the power supply is carried out by a power supply shutdown system of the exposure apparatus. A deferment period may be set in order to allow an operation of the exposure body section to be stopped before a power supply of the second control system is shut down.

BRIEF DESCRIPTION THE DRAWINGS

DETAILED DESCRIPTION OF THE INVENTION

An embodiment of the exposure method and exposure apparatus according to the present invention will now be described with reference made to the drawings.

Figure 2:
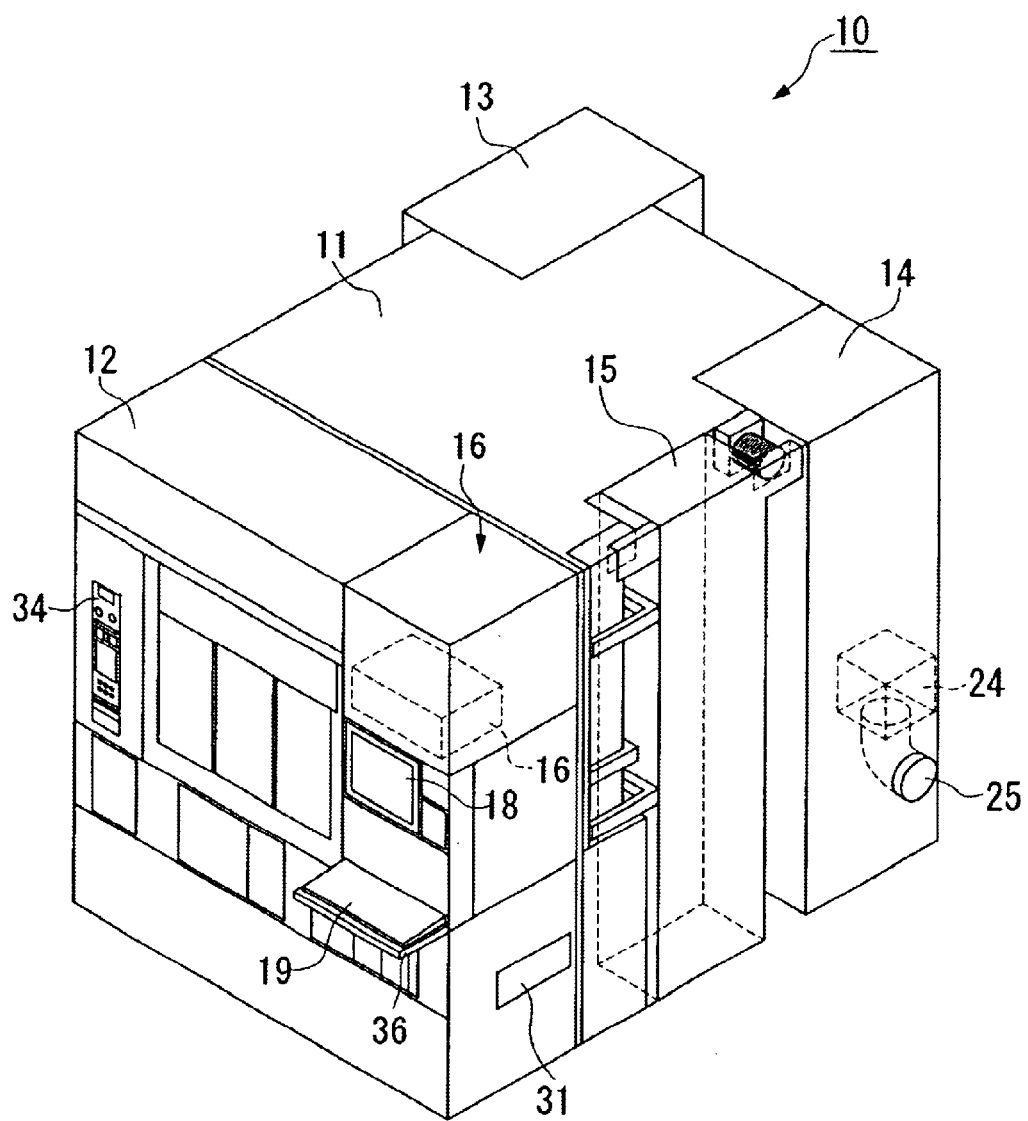
FIG. 2 is an exterior perspective view showing an example of the overall structure of the exposure apparatus according to the present invention.

FIG. 2 is an exterior perspective view showing the overall structure of an exposure apparatus 10 used in the present embodiment. Firstly, the structure of the exposure apparatus 10 will be described with reference to FIG. 2.

Although omitted from the drawing, the exposure apparatus 10 is provided with equipment such as an apparatus main body (in the present embodiment this includes an illumination system, a projection optical system, a mask stage, a wafer stage, an alignment system and the like) that performs exposure processing, a wafer transporting system that transports a wafer (i.e., a photosensitive substrate) serving as the exposure subject, a reticule transporting system that transports a mask (including a reticule—referred to below simply as "reticule") on which is formed the pattern that is to be transferred, an air-conditioning system that controls and purifies the environment (for example, the temperature and the like) within a chamber, a control system (i.e., a control unit) that controls the optical system and transporting systems, a temperature control system that supplies a cooling medium to the motors of the optical system and transporting systems as well as to other actuators, and an operating system formed by a host computer serving as an engineering workstation having an input/output device for managing operating states of the exposure apparatus and the like.

The apparatus main body is housed inside a main body chamber 11 whose internal environment is controlled by an air-conditioning system. The reticle transporting system is housed in the upper level of a chamber that is vertically divided into two levels in a transporting chamber 12 whose internal environment is controlled by the air-conditioning system, while the wafer transporting system is housed in the lower-level thereof. An air-conditioning apparatus that constitutes the air-conditioning system is housed in an air-conditioning chamber (i.e., cabinet) 13, and a temperature control apparatus that constitutes the temperature control system is housed in a temperature control chamber (i.e., cabinet) 14. A control unit that constitutes the control system is housed in a control chamber (i.e., cabinet) 15.

The host computer EMS that constitutes the operating system is housed in an operation section chamber (i.e., cabinet) 16, and input/output apparatuses 18 and 19 are connected to the operation section chamber 16. In this embodiment, the respective chambers 11 to 16 are composed of a metal such as stainless-steel, steel, aluminum, copper, brass, or the like, or some other element having an electromagnetic shield function.

The apparatus main body that is housed in the main body chamber 11 is a step and scan type of reduced size projection exposure apparatus (not shown in the drawings). This reduced size projection exposure apparatus projects, at a reduced size, a portion of a pattern on a reticle, which serves as a mask, onto a wafer on which resist has been coated, which serves as a photosensitive substrate, via a projection optical system. In this state, by synchronously moving the reticle and wafer relative to the projection optical system, the reduced size projection exposure apparatus sequentially transfers a reduced image of the pattern on the wafer onto each shot area on the wafer, so as to form a semiconductor device on the wafer.

Laser beams serving as an exposure beam that are pulse emitted from an exposure light source that oscillates a KrF excimer laser (having a wavelength of 248 nm) illuminate at a uniform brightness distribution an illumination area having a rectangular configuration on a reticle held on the reticle stage via an illumination system (i.e., an illumination optical system) that includes a beam shaping/modulating optical system, an optical integrator, an aperture diaphragm, a relay lens, a condenser lens and the like. The pattern within the illumination area on the reticle is reduced by a projection magnification of α (wherein α is, for example, ¼, ⅕, or the like) via the projection optical system, and a reduced image of this pattern is projected onto a wafer on which photoresist has been coated. The wafer is suction adhered to the wafer stage via a wafer holder. Based on control by the control unit, the reticle stage and wafer stage are then driven so that the wafer and reticle are moved in synchronization in either the same direction or in opposite directions at a predetermined speed ratio (that corresponds to the projection magnification α of the projection optical system). As a result, the pattern on the reticle is transferred onto the shot area on the wafer. The apparatus main body is installed via a vibration isolator on an installation surface (either the floor of the clean room or a castor frame or the like placed on that floor). Note that, as the exposure beam, harmonics of luminescent rays such as i-rays (having a wavelength of 365 nm) from a mercury lamp, or ArF excimer laser beam (having a wavelength of 193 nm), $F_2$ laser beam (having a wavelength of 157 nm), $Ar_2$ laser beam (having a wavelength of 126 nm), or a YAG laser or solid laser (for example, a semiconductor laser) can be used.

The transporting chamber 12 is divided vertically into two levels. The reticle transporting system is housed in the top level, while the wafer transporting system is housed in the bottom level. These transporting systems are apparatuses for automatically transporting a reticle or wafer. The wafer transporting system has a robot hand having a hand portion that holds a wafer by suction. This robot hand is able to move inside the transporting chamber 12. The robot hand takes wafers from a wafer cassette or wafer mounting base positioned inside the transporting chamber 12 and transports them to a transfer position where they are transferred to the apparatus main body. In addition, the robot hand stores wafers that have been handed over by the apparatus main body at the transfer position in a wafer cassette or the like. The robot hand is also able to transfer wafers between a coater (i.e., a resist coating apparatus) and a developer (i.e., a developing apparatus) via an aperture 31 that is formed in left and right side surfaces of the transporting chamber 12 so as to penetrate the interior thereof. Note that, because the structure of the reticle transporting system is substantially the same as that of the wafer transporting system a description thereof is omitted. An operation panel 34 used for the input of commands and the like relating to the air-conditioning of the chamber and the like is mounted on a front surface of the transporting chamber 12.

Air whose temperature has been adjusted by the air-conditioning apparatus housed in the air-conditioning chamber 13 is supplied to the main body chamber 11 via ducts, and a HEPA filter used for dust removal and a chemical filter, which removes sulphate ions, ammonium ions, and silicon based organic materials, that are provided inside the main body chamber 11. Inside the main body chamber 11, a suction aperture is provided on the opposite side to an air supply aperture so that purified air that is supplied to the main body chamber 11 is returned to the air-conditioning apparatus via the suction aperture and ducts.

Air whose temperature has been adjusted by the air-conditioning apparatus is also supplied to the upper level of the transporting chamber 12 via ducts, and a HEPA filter used for dust removal and a chemical filter, which removes sulphate ions, ammonium ions, and silicon based organic materials, that are provided inside the upper level of the transporting chamber 12. Inside the upper level of the transporting chamber 12, a suction aperture is provided on the opposite side to an air supply aperture so that purified air that is supplied to the upper level of the transporting chamber 12 is returned to the air-conditioning apparatus via the suction aperture and ducts.

In addition, air whose temperature has been adjusted by the air-conditioning apparatus is also supplied to the lower level of the transporting chamber 12 via ducts, and a HEPA filter used for dust removal and a chemical filter, which removes sulphate ions, ammonium ions, and silicon based organic materials, that are provided inside the lower level of the transporting chamber 12. Inside the upper level of the transporting chamber 12, a suction aperture is provided on the opposite side to an air supply aperture so that purified air that is supplied to the lower level of the transporting chamber 12 is returned to the air-conditioning apparatus via the suction aperture and ducts.

The respective ducts (both supply and exhaust ducts) that are connected to the air-conditioning apparatus are positioned so as to penetrate in an airtight manner a wall surface of the air-conditioning chamber 13 and a wall surface of the main body chamber 11. The duct that supplies air to the transporting chamber 12 passes through the interior of the main body chamber 11 so as to reach the upper level of the transporting chamber 12. From there a duct branches off so as to reach the lower level of the transporting chamber 12. Note that the providing of the chemical filter is not essential and depends on the environment (i.e., the degree of purification and the like) inside the clean room in which the exposure apparatus 10 is installed. In addition, the air-conditioning apparatus may also control the humidity and pressure and the like of the air that is supplied to each chamber.

The temperature control apparatus that is housed in the temperature control chamber 14 is an apparatus that cools and circulates a cooling medium used to cool actuators of linear motors that drive the reticle stage and wafer stage, motors for the reticle and wafer transporting system, projection optical systems (i.e., lens barrels) and holding portions thereof (i.e., frames), and other actuators and the like. Pipes that constitute the circulation system of the cooling medium penetrate side walls of the main body chamber 11 and are fed to the relevant actuators and the like of the apparatus main body and transporting system.

An exhaust heat fan 24, which is a portion of the air-conditioning system, is also provided inside the temperature control chamber 14. This exhaust heat fan 24 discharges air in the interior of the temperature control chamber 14 to the outside via an exhaust heat aperture 25 that is formed in a side surface of the temperature control chamber 14 so as to cool the interior of temperature control chamber 14. In addition, it also cools the interior of the operation section chamber 16 and the interior of the control chamber 15 in which the control unit (described below) is housed.

The control unit housed in the control chamber 15 is constructed by performing the plug-in packaging into a motherboard of a plurality of printed board packages (i.e., daughter boards) that perform the driving of the reticle stage and wafer stage of the apparatus main body, the altering of the exposure conditions of the illumination system, the transporting of the reticle and wafer by the transporting system, as well as performing other control and supply of power and the like. Electrical connections between the mother board and the objects of control and power supply as well as the host computer EMS are made via connection cables (LAN or the like). These connection cables are provided so as to penetrate a wall surface of the control chamber 15, a wall surface of the main body chamber 11, a wall surface of the operation section chamber 16 and the like. The printed board packages are constructed by packaging on a printed board electronic components that include a plurality of heat generating components (i.e., IC, LSI, and the like).

The host computer (i.e., engineering workstation) EMS is provided in order to control the exposure apparatus. A display 18 serving as an output apparatus (i.e., a display apparatus) is mounted on the front surface side of the operation section chamber 16. Below this is mounted a shelf 36 that is either fixed or is able to be opened and closed. A keyboard 19 is placed on the shelf 36 to serve as an input apparatus. An operator or maintenance worker inputs data and other commands using this keyboard 19, and verifies the operating state and the like of the exposure apparatus using the display 18. In this embodiment a liquid crystal display apparatus is used for the display 18, however, a CRT display apparatus may also be used.

The control unit housed in the control chamber 15 and the host computer EMS housed in the operation section chamber 16 are cooled by the operation of the exhaust heat fan 24 provided in the temperature control chamber 14. Namely, air from the outside is introduced into the operation section chamber 16 by the operation of the exhaust heat fan 24, and is guided into the control chamber 15 via the ducts. In addition, air from the outside is introduced from an intake aperture in a bottom portion of the control chamber 15 and is introduced into the temperature control chamber 14 together with air from the duct. It is then discharged to the outside via the exhaust heat aperture 25. By performing this type of air circulation, heat from the respective apparatuses can be discharged to the outside. Note that the exposure apparatus is installed inside the clean room, however, it is desirable that exhaust air from the aforementioned exhaust heat aperture 25 is discharged to the outside of the clean room via a duct or the like.

Next, the system structure of the exposure apparatus 10 will be described with reference made to FIG. 1.

An air-conditioning system control unit 51 that controls operations of the air-conditioning apparatus 50, a temperature control system control unit 53 that controls operations of the temperature control apparatus 52, a stage control unit 54 that controls operations of the reticle stage and wafer stage, an illumination system control unit 55 that controls exposure conditions of the illumination system, and a transporting system control unit 56 that controls operations of the reticle transporting system and the wafer transporting system are each connected to the host computer EMS. Note that, in actual fact, a variety of types of control unit are provided (not shown in the drawing), however, in FIG. 1, for reasons of simplification, only the above described control unit is shown.

The switching (i.e., turning on or off) of the main power supply to the overall exposure apparatus is performed by a main power supply switch 60 that is formed by a magnetic coil or the like. The main power switch 60 has a delay timer 61 that allows a predetermined time, which is set in advance, to pass. In the present embodiment, by supplying a power supply shut down signal to this delay timer 61, the main power supply can be shut down after a predetermined time has been allowed to pass before the shut down of the power supply. Note that, as is described below, a waiting time Ta set in the delay timer 61 is a time needed to stop the control units 54 to 56 when they are in operation without causing any malfunction. In addition, an operation power switch 62 that is formed by a magnetic coil or the like is provided downstream from the main power switch 60 in order to switch the power supply to the host computer EMS.

Figure 1:
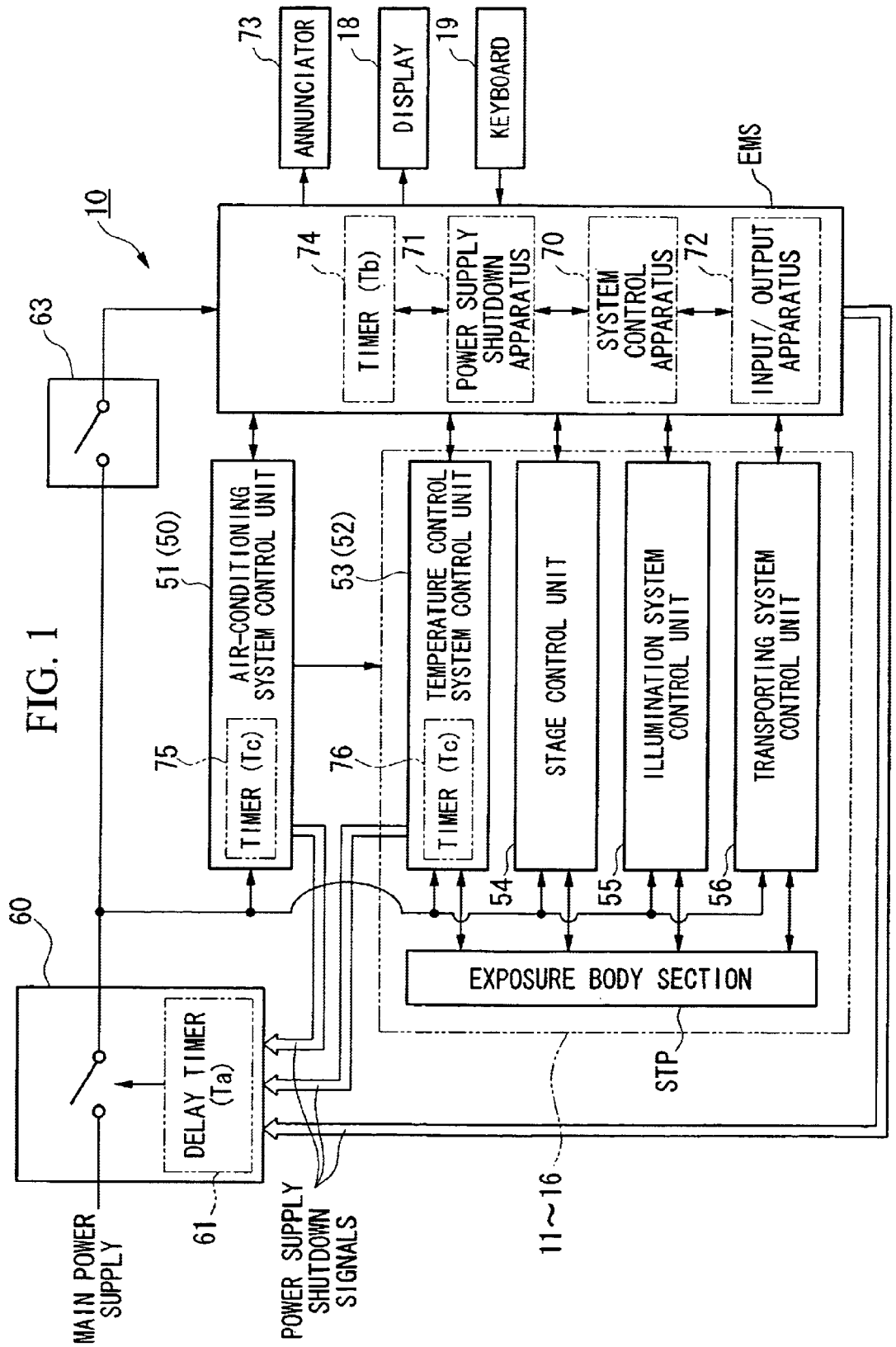
FIG. 1 is a view showing an example of the system structure of the exposure apparatus according to the present invention.

The interior of the host computer EMS shown in FIG. 1 is shown as a function block diagram based on software. In the host computer EMS, a system control apparatus 70 is main software (i.e., originating task) that controls operations of the overall mechanism section of the exposure body section STP formed by the above described apparatus main body, wafer transporting system, reticle transporting system and the like. The series of operations of the control units 54 to 56 that are connected to the exposure body section STP are all executed via this system control apparatus 70.

A power supply shut down apparatus 71 that is formed by software that controls the shut down of the main power supply when an error occurs or the like is set in the host computer EMS. In addition, a sequence (i.e., software) that starts up the power supply shut down apparatus 71 is included within the system control apparatus 70. When an error occurs in the air-conditioning apparatus 50 or the temperature control apparatus 52, the respective error occurrence information is supplied from the air-conditioning system control unit 51 or the temperature control system control unit 53 to the system control apparatus 70. Corresponding to this, the system control apparatus 70 is able to start up the power supply shut down apparatus 71. In addition, a function for stopping the control units 54 to 56 and a function for supplying power supply shut down signals to the delay timer 61 are included in the power supply shut down apparatus 71.

An input/output apparatus 72 is also included within the host computer EMS. An operator is able to input respectively to the system control apparatus 70 and the power supply shut down apparatus 71 via an external keyboard 19 and the input/output apparatus 72 various types of command, normal exposure sequences, commands when an error is terminated, or various parameters or the like. Various types of information are also able to be displayed to the operator from the system control apparatus 70 and the power supply shut down apparatus 71 via both the input/output apparatus 72 and the external display 18. An annunciator 73 that announces an error by emitting, for example, an alarm noise or light is also connected to the host computer EMS. The power supply shut down apparatus 71 is able to announce an error (i.e., call an operator) via this annunciator 73 and the display 18. Furthermore, an internal timer 74 for measuring time is included within the host computer EMS, and the power supply shut down apparatus 71 is able to read the start of a time measurement by this internal timer 74 and also how much time has lapsed.

Internal timers 75 and 76 for measuring time are also included respectively in the air-conditioning system control unit 51 and the temperature control system control unit 53, and the air-conditioning system control unit 51 and the temperature control system control unit 53 are able to read start times of time measurements by the respective internal timers 75 and 76 and also how much time has lapsed. The air-conditioning system control unit 51 and the temperature control system control unit 53 are also able to supply a power supply shut down signal to the delay timer 61 even if the relevant software task of the host computer EMS has not started up, or if the host computer EMS freezes or shuts down.

Figure 3:
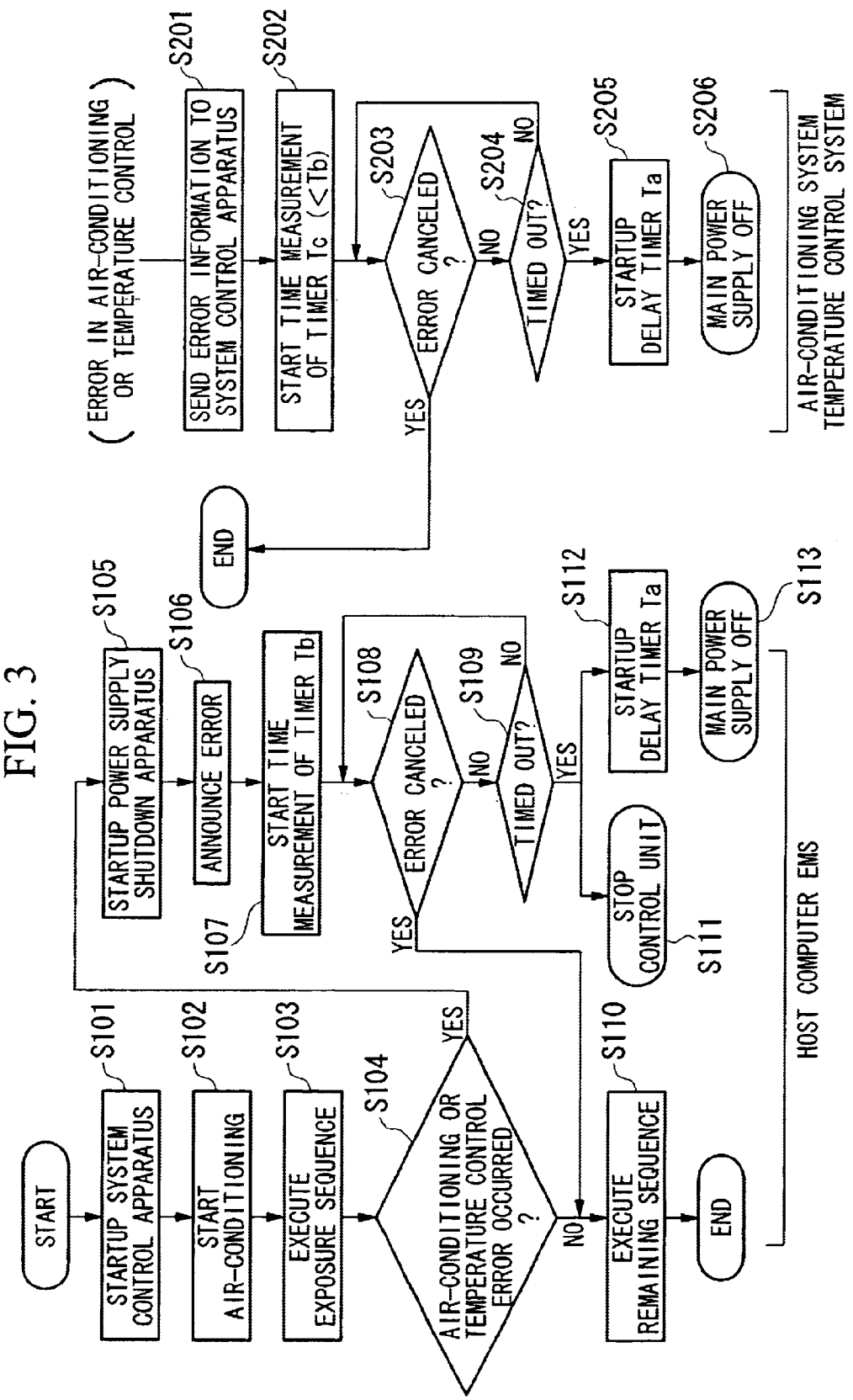
FIG. 3 is a flow chart showing an example of the operation of the exposure method according to the present invention.

Next, an example of an operation when an error (in particular, an unrecoverable error) occurs in the air-conditioning system or temperature control system in the present embodiment will be described with reference made to the aforementioned system structure diagram shown in FIG. 1 and the flowchart shown in FIG. 3.

Firstly, when the exposure processing of the exposure body section STP is started, an operator turns on the main power supply of the overall exposure apparatus using the main power supply switch 60. The operator then operates the operation power supply switch 62 so as to start up the system control apparatus 70 (step 101). Next, the operator inputs exposure conditions and the like into the system control apparatus 70 via the keyboard 19. Note that, if there is an alteration in the conditions for the air-conditioning (such as the air-conditioning temperature or the like), the operator inputs those air-conditioning conditions using the operation panel 34 shown in FIG. 2 described above. In addition, when the main power supply is turned on, the air-conditioning apparatus 50 performs the air-conditioning of each of the chambers 11 to 16 based on the input air-conditioning conditions (step 102).

When the environments inside each of the chambers 11 to 16 are controlled by the air-conditioning apparatus 50, the system control apparatus 70 controls the operations of the temperature control apparatus 52 and the control units 54 to 56 in accordance with the exposure conditions input by the operator. As a result, the exposure body section STP operates in accordance with a predetermined sequence (step 103).

In the next step 104, if an unrecoverable error occurs in the air-conditioning apparatus 50 (or in the temperature control apparatus 52) such as the air-conditioning or temperature control being interrupted while an exposure sequence is being executed, error information is supplied from the air-conditioning system control unit 51 (or from the temperature control system control unit 53) to the system control apparatus 70 (step 201). Note that, even in a frozen state in which no signal is supplied from the air-conditioning system control unit 51 (or from the temperature control system control unit 53), the system control apparatus 70 recognizes that an error has occurred in the air-conditioning apparatus 50 (or in the temperature control apparatus 52). When this error occurs, the air-conditioning system control unit 51 (or the temperature control system control unit 53) also independently starts a time measurement using the internal timer 75 (or the internal timer 76) (step 202).

When the system control apparatus 70 recognizes the error in the air-conditioning apparatus 50 (or the temperature control apparatus 52), it starts up the power supply shut down apparatus 71 (step 105). As a result, the shut down sequence that is described below is executed.

In the shut down sequence, firstly, the power supply shut down apparatus 71 announces to the operator that an error has occurred in the air-conditioning apparatus 50 (or in the temperature control apparatus 52) via the annunciator 73 and the display 18 (step 106), and starts a time measurement by the internal timer 74 (step 107). Next, in step 108, the power supply shut down apparatus 71 checks whether the error has been cancelled (i.e., cancelled by the operator), and then, in step 109, checks whether or not the time being measured by the internal timer 74 has reached a predetermined waiting time Tb. Steps 108 and 109 are repeated until the time reaches the waiting time Tb. If the error is cancelled during these steps, the routine moves to step 110 and the remaining exposure sequence is executed. Note that the cancellation of the error is performed by the operator via an alarm cancel switch provided in the annunciator 73 or via the keyboard 19 or the like. Furthermore, information relating to the error cancellation at this time is also supplied to the air-conditioning system control unit 51 and the temperature control system control unit 53.

If, however, in step 109, the error is not cancelled, then when the time being measured by the internal timer 74 reaches the waiting time Tb (i.e., when the internal timer 74 times out), the power supply shut down apparatus 71 terminates the operations of the control units 54 to 56 (step 111), and supplies a power supply shut down signal to the delay timer 61. Note that the waiting time Ta set in the delay timer 61 is a time needed to safely stop the control units 54 to 56 when they are in operation without causing any malfunction, and may be, for example, approximately one minute.

When the delay timer 61 receives the power supply shut down signal, it starts a time measurement. When a preset waiting time Ta is reached, the main power supply of the overall exposure apparatus is turned off using the main power supply switch 60 (step 113). As a result, the shut down sequence of the overall exposure apparatus is completed.

In the air-conditioning system control unit 51 (or the temperature control system control unit 53) an independent power supply shut down sequence is executed using the internal timer 75 (or the internal timer 76) in parallel with a shutdown sequence performed by the power supply shut down apparatus 71 that is described above. Namely, after the air-conditioning system control unit 51 (or the temperature control system control unit 53) has checked in step 203 whether or not the error has been cancelled (i.e., cancelled by the operator), it checks in step 204 whether or not the time being measured by the internal timer 75 (or 76) has reached a predetermined waiting time Tc (for example, approximately 5 to 15 minutes). This waiting time Tc that is set in the air-conditioning system control unit 51 and the temperature control system control unit 53 is set as a longer time (Tc>Tb) than the waiting time Tb that is set in the internal timer 74 used in the above described shutdown sequence. Steps 203 and 204 are repeated until the waiting time Tc is reached, and if the error is cancelled before the waiting time Tc is reached, the air-conditioning system control unit 51 (or the temperature control system control unit 53) stops the count of the internal timer 75 (or 76). If, however, in step 204, the time being measured by the internal timer 75 (or 76) reaches the waiting time Tc (i.e., times out) without the error being cancelled, the air-conditioning system control unit 51 (or the temperature control system control unit 53) supplies a power supply shut down signal to the delay timer 61 (step 205). As is described above, when the delay timer 61 receives the power supply shut down signal, it starts a time measurement. When this reaches the preset waiting time Ta, the main power supply of the overall exposure apparatus is turned off using the main power supply switch 60 (step 206).

When the shutdown sequence performed by the power supply shut down apparatus 71 described above is executed normally, because the main power supply is shut down during this shutdown sequence, the power supply shut down sequence performed by the air-conditioning system control unit 51 or the temperature control system control unit 53 ends at that point. If, however, the host computer EMS is stopped, or a task is not started up or freezes, so that the above described shutdown sequence is not completed, then after the waiting time Tc of the internal timer 75 or the internal timer 76 has passed, the main power supply of the overall exposure apparatus is forcibly turned off.

As has been described above, according to the present embodiment, if an unrecoverable error occurs in the air-conditioning apparatus 50 or the temperature control apparatus 52, a sequence (i.e., the shut down sequence performed by the power supply shut down apparatus 71 or the power supply shutdown sequence performed by the air-conditioning system control unit 51 or the temperature control system control unit 53) to shut down the main power supply is started up, and the exposure apparatus is shut down based on this sequence. As is described above, a large number of heat generating components are provided in the control units 54 to 56 and in the exposure body section STP. Consequently, if the temperature control by the air-conditioning apparatus 50 and temperature control apparatus 52 is no longer sufficient, there is a concern that the temperature of the exposure body section STP will greatly increase. However, in the present embodiment, by turning off the main power supply when an error occurs in the air-conditioning or temperature control, the supply of power to these heat generating components is stopped so that the generation of heat is completely suppressed. As a result, it is possible to reliably suppress the effects of heat on components such as the optical system elements in the exposure body section STP.

Moreover, in the present embodiment, an error in the air-conditioning apparatus 50 or temperature control apparatus 52 is announced by the annunciator 73 or the like, and while the time Tb set in the internal timer 74 is passing, the routine waits for the error to either be cancelled by the operator or to recover. In this case, it can be considered that a short time will pass from the occurrence of the error in the air-conditioning or temperature control until the increase in temperature in the chambers 11 to 16 or in the exposure main body STP becomes a problem. Accordingly, by canceling the error or by allowing the error to recover during this time, it is possible to avoid unnecessary power shutdowns and to control decreases in throughput.

Furthermore, if the main power supply is suddenly turned off, there are concerns that damage or breakages will occur in the mechanism section of the exposure body section STP. However, in the above described shutdown sequence performed by the power supply shut down apparatus 71, because the main power supply is turned off after operations of the control units 54 to 56 have been stopped, these concerns do not exist. Moreover, because the time until the operations of the control units 54 to 56 stop is counted by the delay timer 61 provided in the main power supply switch 60, it is possible to allow the time until the main power supply is turned off to pass with a great deal of reliability.

Furthermore, in the present embodiment, if an error occurs in the air-conditioning apparatus 50 or at the temperature control apparatus 52, a power supply shutdown sequence is executed independently by the air-conditioning system control unit 51 or the temperature control system control unit 53 in parallel with the shut down sequence performed by the power supply shut down apparatus 71 so that the power supply is forcibly shutdown. Therefore, even if the host computer EMS is not started up, or if the relevant software is not operated, or if some problem occurs on the host computer EMS side, so that a situation arises in which it is not possible for the main power supply to be turned off, then as a result of the above described power supply shutdown sequence being executed independently from the host computer EMS, the main power supply can be reliably shutdown.

Figure 4:
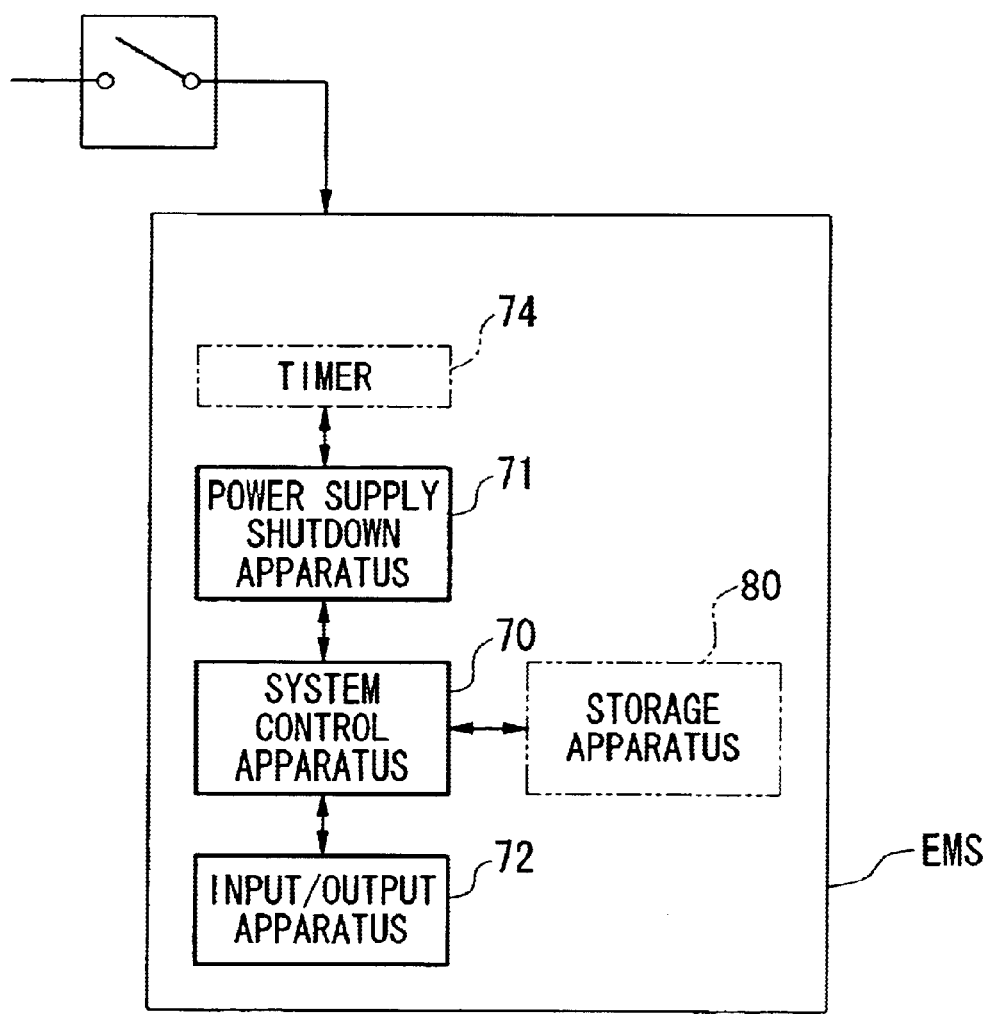
FIG. 4 is a view showing another example of the system structure of the exposure apparatus according to the present invention.

FIG. 4 shows another example of the system structure of the exposure apparatus according to the present invention.

In this example, a storage apparatus 80 formed by memory or the like that stores operating states of the exposure body section STP is provided inside the host computer EMS. In the exposure apparatus shown in FIG. 4, because the structure of the other portions is the same as that of the portions shown in FIG. 1, the same descriptors as are used in FIG. 1 are allocated and a description thereof is omitted.

In this example, when the system control apparatus 70 recognizes an error in the air-conditioning apparatus 50 (or in the temperature control apparatus 52), the power supply shutdown apparatus 70 is started up and the operating state (i.e., the running state and the log sequence up until the error occurred) of the exposure body section STP at that moment is stored in the storage apparatus 80. Next, the shut down sequence is executed by the power supply shutdown apparatus 71, and the main power supply of the exposure apparatus is shut down. When the power supply is next turned on, the operator is first informed by the storage apparatus 80 that an unrecoverable error has occurred. Subsequently, in accordance with the operating state (i.e., the log sequence) stored in the storage apparatus 80, operations of the control units 54 to 56 are controlled without input from the operator, and the sequence is automatically executed up until the stage where the previous error occurred. As a result, the operating state of the exposure body section STP is rapidly restored to the stage where the error occurred enabling throughput to be improved.

Note that, the operating procedure given in the above described example and the various configurations and combinations and the like of the respective component elements are merely an example thereof, and various modifications are possible based on processing conditions and design requirements insofar as they do not depart from the scope of the present invention.

For example, in the above described example, the power supply that is shut down when an error occurs in the air-conditioning system or temperature control system is the main power supply, however, the power supply that is shut down is not limited to this. Namely, it is sufficient if the supply of power is shut down to those sections that are provided with a large number of heat generating components such as the control system.

Furthermore, in the above described example, the explanation is given on the assumption that an error has occurred in the air-conditioning system (i.e., in the air-conditioning apparatus 50 shown in FIG. 1) or in the temperature control system (i.e., in the temperature control apparatus 52), however, the present invention is not limited to this assumption. Namely, if the power supply of the air-conditioning system or temperature control system is shut down before the power supply to the above described control systems (i.e., the stage control unit 54, the elimination system control unit 55, and the transporting system control unit 56) is shut down, there may be a reduction in the apparatus performance (in particular, in the optical characteristics and the like of the illumination system or projection optical system) due to heat generated from that control system or the like. Therefore, it is desirable that, prior to the shutting down of power to the air-conditioning system or temperature control system, the power supply to control systems that may be factors in reducing apparatus performance or the like (i.e., the control units 54 to 56) is shut down by applying the principle of the present invention.

It is also possible for the power supply of the air-conditioning system or temperature control system to be shut down at substantially the same time as the power supply for the aforementioned control system is shut down (namely, it is possible to set the above described waiting times such that Tc≈Tb). Furthermore, it is also possible for the power supply of the air-conditioning system or temperature control system to be shut down earlier than the power supply of the above described control system is shut down by a predetermined length of time that allows the effects of the above described heat generating member on the optical elements and the like of the exposure main body STP to be restricted to within a permissible range (namely, it is possible to set the above described waiting times such that Tc<Tb). It is also preferable that the timing of the shut down of the power supply of the air-conditioning system or temperature control system is decided with consideration given to residual heat from heat generating members and the like that remains after the power supply of the above described control system has been shutdown.

Moreover, in the above described example, an explanation is given concerning the air-conditioning system (i.e., the air-conditioning apparatus 50) or the temperature control system (i.e. the temperature control apparatus 52) of a chamber (i.e., the chambers 11 to 16 shown in FIG. 1), however, in an exposure apparatus in which at least a portion of an exposure beam optical path, for example, an illumination system and a projection optical system is purged using an inert gas, if the power supply of a gas supply apparatus that supplies this inert gas is shut down before the power supply of the above described control system (i.e., the stage control unit 54, the illumination system control unit 55, and the transporting system control unit 56) and the like is shut down, then the same type of problem as that described above may occur. Therefore, it is desirable that the power supply of the above described control system (i.e., the control units 54 to 56) and the like are shut down by applying the principle of the present invention before the power supply of this gas supply apparatus is shut down. Note that if some type of error occurs in the gas supply apparatus so that the aforementioned optical path purge conditions cannot be maintained, it is preferable that the above described example be applied as it is. In addition, it is desirable that a structure is employed in which the gas supply apparatus includes, for example, a gas supply system that supplies an inert gas (for example, nitrogen, helium, or the like) to the exposure beam optical path and a control system that controls the supply conditions (i.e., the temperature, pressure, humidity and the like) of the inert gas, and if an error occurs in at least one of the gas supply system and control system, then the power supply of the above described control system and the like is shut down prior to the shut down of the power supply of that system in which the error has occurred. By shutting down in this manner the power supply of a control system (i.e., a second control system) that controls operations of the exposure apparatus main body section prior to the shutting down of the power supply of a control system (i.e., a first control system) that controls the environment inside a chamber (including the purge space) such as the air-conditioning system, temperature control system, and also the aforementioned gas supply control system, it is possible to suppress any deterioration in the apparatus performance (i.e., optical characteristics and the like) of the exposure apparatus.

Note that, in the above described example, the air-conditioning system and temperature control system are each positioned adjacent to the exposure body section STP, however, it is also possible for at least a portion of each of the air-conditioning system and temperature control system to be positioned in a separate space from the clean room in which the exposure apparatus is placed, such as, for example, a space below the floor of the clean room.

The exposure method of the exposure apparatus to which the present invention is applied is not limited to a scan exposure method in which a mask (i.e., a reticle) and a substrate (i.e., a wafer) undergo relative movement relative to an exposure illumination beam (such as, for example, a step and scan method). It is also possible to employ a stationary exposure method in which a mask pattern is transferred onto a substrate with the mask and substrate in a substantially stationary state, such as, for example, a step and repeat method. Furthermore, it is also possible to apply the present invention to an exposure apparatus or the like that uses a step and stitch method in which a pattern is transferred onto each of a plurality of shot areas whose peripheral portions overlap on a substrate. The projection optical system PL may be any one of a reduction system, an equivalent magnification system, and an enlargement system, and may also be any one of a refractive system, a cata-dioptric system, and a reflective system. The present invention may also be applied to an exposure apparatus or the like that does not use a projection optical system such as, for example, a proximity type of exposure apparatus.

As the illumination light used for exposure of the exposure apparatus to which the present invention is applied, it is possible to use not only ultraviolet light such as g-rays, i-rays, KrF excimer laser beam, ArF excimer laser beam, $F_2$ laser light, and $Ar_2$ laser beam, but also, for example, EUV light, X-rays, and charged particle rays such as electron beams and ion beams. In addition, as the light source for the exposure, it is possible not only to use a mercury lamp or excimer laser, but also a harmonic generating device such as a YAG laser or semiconductor laser, an SOR, a laser plasma light source, or an electron gun or the like.

Exposure apparatuses to which the present invention is applied are not limited to exposure apparatuses used for manufacturing semiconductor devices, and may also be exposure apparatuses that are used in the manufacture of microdevices (i.e., electronic devices) such as liquid crystal display devices, display apparatuses, thin film magnetic heads, image pickup devices (such as CCD), micromachines, and DNA chips and the like, or in the manufacture of photomasks and reticules used in exposure apparatuses.

Moreover, the present invention can also be applied not only to exposure apparatuses, but also to other manufacturing apparatuses (including scanning apparatuses and the like) that are used in device manufacturing steps.

If a linear motor is used for the above described wafer stage and reticule stage, then either an air flotation type that uses air bearings or a magnetic flotation type that uses Lorentz's force or reactance force can be used. The stage may be a type that moves along guides or may be a guideless type in which guides are not provided. Furthermore, if a planar motor is used as a drive apparatus for the stage, then one of either a magnetic unit (i.e., a permanent magnet) and an armature unit may be connected to the stage and the other of the magnetic unit and armature unit may be provided at the moving surface side (i.e., a surface plate or base) of the stage.

Reaction force generated by the movement of the wafer stage may be allowed to escape mechanically to the floor (i.e., to the ground) using a frame member, as is described in Japanese Patent Application, First Publication No. 8-166475. In addition, reaction force generated by the movement of the reticule stage may be allowed to escape mechanically to the floor (i.e., to the ground) using a frame member, as is described in Japanese Patent Application, First Publication No. 8-330224. The present invention can also be applied to exposure apparatuses provided with these types of structure.

An exposure apparatus to which the present invention is applied is manufactured by assembling various subsystems that include the respective component elements described in the claims of the present application such that predetermined mechanical precision, electrical precision, and optical precision are maintained. In order to guarantee each of these precisions, before and after the assembly, adjustments to achieve optical precision in each of the various optical systems, adjustments to achieve mechanical precision in each of the various mechanical systems, and adjustments to achieve electrical precision in each of the various electrical systems are performed. Mechanical connections, electrical circuit wiring connections, pneumatic circuit piping connections, and the like between the various subsystems are included in the steps to assemble the exposure apparatus from the various subsystems. It is to be understood that steps to assemble each individual subsystem are performed before the steps to assemble the exposure apparatus from the various subsystems. After the steps to assemble the exposure apparatus from the various subsystems have ended, overall adjustment is performed so that each of the precisions are guaranteed in the exposure apparatus as a whole. Note that it is desirable that the manufacture of the exposure apparatus is carried out in a clean room in which temperature and degree of cleanliness and the like-are controlled.

A semiconductor device is manufactured via a step in which the functions and performance of the device are designed, a step in which a mask (reticule) is manufactured based on the design step, a step in which a wafer is manufactured from a silicon material, a wafer processing step in which the pattern on the reticule is exposed-onto the wafer using the above described exposure apparatus, device assembly steps (i.e., including a dicing step, a bonding step, and a packaging step), and an examination step and the like.

What is claimed is:

1. A method of exposing a photosensitive substrate with a radiation beam of an exposure body section, the method comprising:

obtaining information relating to an occurrence of an error in an air-conditioning system that air-conditions an interior of a chamber in which the exposure body section is housed or occurs in a temperature control system that controls a temperature of the exposure body section, and shutting off a power supply of a control system that controls the exposure body section based on the obtained information when the error occurs in the air conditioning system or the temperature control system.

2. An exposure method according to claim 1, wherein the power supply is shut down after a predetermined length of time has passed since the error occurred in the air-conditioning system or the temperature control system.

3. An exposure method according to claim 2, wherein the predetermined length of time includes a length of time to allow an operation of the exposure body section to be stopped.

4. An exposure method according to claim 2, wherein, when an error has occurred in the air-conditioning system or the temperature control system, the predetermined length of time includes a waiting time in which a command regarding the error is awaited after the error has been announced.

5. An exposure method according to claim 4, wherein the power supply is forcibly shut down after the waiting time has passed.

6. An exposure method according to claim 1, wherein, before the power supply is shut down, an operating state of the exposure body section at the time the error occurred in the air-conditioning system or the temperature control system is stored.

7. An exposure method according to claim 1, wherein the power supply of the air-conditioning system or the temperature control system is shut down after the power supply of the control system has been shut down.

8. An exposure method according to claim 1, wherein a power supply of the air-conditioning system or temperature control system is shut down after a predetermined time has passed since the error occurred, and a power supply of the control system is shut down at a timing that allows effects of the shutting down of the power supply of the air-conditioning system or temperature control system on the exposure body section to be kept within a permissible range.

9. An exposure method according to claim 8, wherein a power supply of the control system is shut down after a deferment period has passed since the error occurred in order to allow an operation of the exposure body section to be stopped, and a power supply of the air-conditioning system or temperature control system is shut down substantially simultaneously with a shutting down of a power supply of the control system or after the power supply of the control system has been shut down.

10. An exposure method according to claim 9 wherein measurement of the deferment period commences after a first waiting time has passed since the error occurred.

11. An exposure method according to claim 9 wherein, when the power supply of the control system is shut down as a result of the main power supply of the exposure body section being shut down, the power supply of the air-conditioning system or temperature control system is shut down at the same time as the power supply of the control system is shut down.

12. An exposure method according to claim 11, wherein if the main power supply is not shut down even when the deferment period has passed, the power supply of the control system is shut down at the same time as the power supply of the air-conditioning system or temperature control system is shut down by shutting down the main power supply after the predetermined time has passed.

13. An exposure method according to claim 12, wherein the predetermined time includes a second waiting time that is set after the error occurs.

14. An exposure method according to claim 13, wherein the second waiting time is set longer than the first waiting time.

15. An exposure apparatus comprising:

an exposure body section housed in a chamber to expose a photosensitive substrate using a radiation beam;

a control system connected to the exposure body section;

an air-conditioning system that air-conditions air in an interior of the chamber;

a temperature control system that controls a temperature of a unit of the exposure body section; and a power supply shutdown system that is connected to the control system and obtains information relating to an occurrence of an error in the air-conditioning system or the temperature control system, and shuts off a power supply of the control system based on the obtained information when the error occurs in the air-conditioning system or the temperature control system.

16. An exposure apparatus according to claim 15, wherein the power supply shutdown system shuts down a main power supply of the entire exposure apparatus.

17. An exposure apparatus according to claim 15, wherein the power supply shutdown system has a timer that allows a predetermined time to pass from when an error occurs in the air-conditioning system or temperature control system until the power supply is shut down.

18. An exposure apparatus according to claim 17, wherein the timer includes a first timer that allows a time required to stop an operation of the exposure body section to pass.

19. An exposure apparatus according to claim 17, wherein the power supply shutdown system has an announcing device that, when an error occurs in the air-conditioning system or temperature control system, announces the error, and the timer includes a second timer that allows a waiting time to pass in which, after the error has been announced, a command regarding the error is awaited.

20. An exposure apparatus according to claim 19, wherein the timer includes a third timer that forcibly shuts down the power supply after the waiting time of the second timer has passed.

21. An exposure apparatus according to claim 15, wherein there is provided a storage apparatus that stores an operating state of the exposure body section at the time the error occurred in the air-conditioning system or the temperature control system.

22. An exposure apparatus according to claim 15, wherein the power supply shutdown system shuts down the power supply of the air-conditioning system or the temperature control system after the power supply of the control system has been shut down.

23. A device manufacturing method that includes a step in which, using the exposure apparatus according to claim 15, a device pattern is transferred onto a photosensitive layer formed on an object.

24. An exposure apparatus according to claim 15, wherein the power supply shutdown system shuts down a power supply of the air-conditioning system or temperature control system after a predetermined time has passed since the error occurred, and shuts down a power supply of the control system at a timing that allows effects of the shutting down of the power supply of the air-conditioning system or temperature control system on the exposure body section to be kept within a permissible range.

25. An exposure apparatus according to claim 24, wherein the power supply control system shuts down a power supply of the control system after a deferment period has passed since the error occurred in order to allow an operation of the exposure body section to be stopped, and a power supply of the air-conditioning system or temperature control system is shut down substantially simultaneously with a shutting down of a power supply of the control system or after the power supply of the control system has been shut down.

26. An exposure apparatus according to claim 25, wherein the power supply shutdown system commences measurement of the deferment period after the first waiting time has passed since the error occurred.

27. An exposure apparatus according to claim 25, wherein, when the power supply control system shuts down the power supply of the control system as a result of the main power supply of the exposure body section being shut down, the power supply of the air-conditioning system or temperature control system is shut down at the same time as the power supply of the control system is shut down.

28. An exposure apparatus according to claim 27, wherein if the main power supply is not shut down even when the deferment period has passed, the power supply control system shuts down the power supply of the control system at the same time as the power supply of the air-conditioning system or temperature control system is shut down by shutting down the main power supply after the predetermined time has passed.

29. An exposure apparatus according to claim 28, wherein the predetermined time includes a second waiting time that is set after the error occurs.

30. An exposure apparatus according to claim 29, wherein the second waiting time is set longer than the first waiting time.

* * * * *